US011483634B2

(12) United States Patent
Okada et al.

(10) Patent No.: US 11,483,634 B2
(45) Date of Patent: Oct. 25, 2022

(54) INFORMATION PROCESSING DEVICE AND ANOMALY VISUALIZING SYSTEM

(71) Applicant: THE CHUGOKU ELECTRIC POWER CO., INC., Hiroshima (JP)

(72) Inventors: Takeshi Okada, Hiroshima (JP); Nobuhiro Ishii, Hiroshima (JP)

(73) Assignee: THE CHUGOKU ELECTRIC POWER CO., INC., Hiroshima (JP)

( * ) Notice: Subject to any disclaimer, the term of this patent is extended or adjusted under 35 U.S.C. 154(b) by 0 days.

(21) Appl. No.: 17/178,870

(22) Filed: Feb. 18, 2021

(65) Prior Publication Data

US 2021/0176541 A1 Jun. 10, 2021

Related U.S. Application Data

(63) Continuation of application No. PCT/JP2018/041547, filed on Nov. 8, 2018.

(51) Int. Cl.

*H04Q 9/00* (2006.01)
*H02J 13/00* (2006.01)
*G01R 22/00* (2006.01)

(52) U.S. Cl.

CPC ............... *H04Q 9/00* (2013.01); *G01R 22/00* (2013.01); *H02J 13/00002* (2020.01); *H02J 13/00006* (2020.01)

(58) Field of Classification Search

CPC .................. H04Q 9/00; H02J 13/00006; H02J 13/00002; G01R 22/00
See application file for complete search history.

(56) References Cited

U.S. PATENT DOCUMENTS 5,568,399 A * 10/1996 Sumic .................. G01R 31/086 700/293
6,259,972 B1 * 7/2001 Sumic .................. H02H 1/0092 700/286

(Continued)

FOREIGN PATENT DOCUMENTS

JP 2000-207671 A 7/2000
JP 2000207671 A * 7/2000 ............ H04M 11/00

(Continued)

OTHER PUBLICATIONS

Feb. 5, 2019 Office Action issued in Japanese Patent Application No. 2019-500901.

(Continued)

*Primary Examiner* — Amine Benlagsir
(74) *Attorney, Agent, or Firm* — Oliff PLC

(57) ABSTRACT

According to an aspect, an information processing device includes: a receiver configured to receive information related to a plurality of smart meters; a controller configured to determine presence or absence of an anomaly in each of the smart meters based on a reception status of the information from each of the smart meters; and an output unit configured to output information indicating presence or absence of an anomaly in each of the smart meters. The receiver receives the information from the smart meters in a cycle of a first predetermined time. The controller determines that an anomaly is occurring in a smart meter from which information has not been obtained for a second predetermined time that is longer than the first predetermined time. The second predetermined time is n times as long as the first predetermined time, and n is equal to or greater than 2.

9 Claims, 9 Drawing Sheets

(56) References Cited

U.S. PATENT DOCUMENTS

| | | | | |
|---|---|---|---|---|
| 2004/0236620 | A1* | 11/2004 | Chauhan | G06Q 10/06<br>705/7.14 |
| 2007/0183369 | A1* | 8/2007 | Angelis | H02J 13/00002<br>370/332 |
| 2007/0211768 | A1* | 9/2007 | Cornwall | G01D 4/004<br>370/509 |
| 2016/0276831 | A1* | 9/2016 | Karlak | G06Q 10/0631 |

FOREIGN PATENT DOCUMENTS

| | | | | | |
|---|---|---|---|---|---|
| JP | 2015-233278 | A | | 12/2015 | |
| JP | 2018-106645 | A | | 7/2018 | |
| JP | 2018-117455 | A | | 7/2018 | |
| JP | 2018106645 | A | * | 7/2018 | H04M 11/00 |
| JP | 2018117455 | A | * | 7/2018 | H04M 11/00 |

OTHER PUBLICATIONS

Apr. 2, 2019 Office Action issued in Japanese Patent Application No. 2019-500901.

Dec. 11, 2018 International Search Report issued in International Patent Application No. PCT/JP2018/041547.

* cited by examiner

FIG.2

| INTEGRATION DEVICE ID | INFORMATION ACQUISITION TIME (yyyy/mm/dd tt:mm) | HISTORY INFORMATION |
|---|---|---|
| SS000001 | 2018/04/01 07:30 | NORMAL |
| SS000002 | 2018/04/01 07:30 | NORMAL |
| SS000003 | 2018/04/01 07:30 | NORMAL |
| . | . | . |
| . | . | . |
| . | . | . |
| SS000001 | 2018/04/01 08:00 | NORMAL |
| SS000002 | 2018/04/01 08:00 | NORMAL |
| SS000003 | 2018/04/01 08:00 | ERROR |
| . | . | . |
| . | . | . |
| . | . | . |
| SS000001 | 2018/04/01 08:30 | NORMAL |
| SS000002 | 2018/04/01 08:30 | NORMAL |
| SS000003 | 2018/04/01 08:30 | ERROR |
| . | . | . |
| . | . | . |
| . | . | . |
| SS000001 | 2018/04/01 09:00 | NORMAL |
| SS000002 | 2018/04/01 09:00 | NORMAL |
| SS000003 | 2018/04/01 09:00 | ERROR |
| . | . | . |
| . | . | . |
| . | . | . |

FIG.3

| SMART METER ID | INFORMATION ACQUISITION TIME (yyyy/mm/dd tt:mm) | INDICATION NUMBER |
|---|---|---|
| SM000001 | 2018/04/01 07:30 | 030467 |
| SM000002 | 2018/04/01 07:30 | 022160 |
| SM000003 | 2018/04/01 07:30 | ERROR |
| . | . | . |
| . | . | . |
| . | . | . |
| SM000001 | 2018/04/01 08:00 | 030468 |
| SM000002 | 2018/04/01 08:00 | ERROR |
| SM000003 | 2018/04/01 08:00 | ERROR |
| . | . | . |
| . | . | . |
| . | . | . |
| SM000001 | 2018/04/01 08:30 | 030469 |
| SM000002 | 2018/04/01 08:30 | ERROR |
| SM000003 | 2018/04/01 08:30 | ERROR |
| . | . | . |
| . | . | . |
| . | . | . |
| SM000001 | 2018/04/01 09:00 | 030470 |
| SM000002 | 2018/04/01 09:00 | ERROR |
| SM000003 | 2018/04/01 09:00 | ERROR |
| . | . | . |
| . | . | . |
| . | . | . |

FIG.4

| SMART METER ID | INDICATION NUMBER | | | | | |
|---|---|---|---|---|---|---|
| | 2018/04/01 | | | | | |
| | ··· | 7:30 | 8:00 | 8:30 | 9:00 | ··· |
| SM000001 | ··· | 030467 | 030468 | 030469 | 030470 | ··· |
| SM000002 | ··· | 022160 | ERROR | ERROR | ERROR | ··· |
| SM000003 | ··· | ERROR | ERROR | ERROR | ERROR | ··· |
| . | ··· | . | . | . | . | ··· |
| . | ··· | . | . | . | . | ··· |
| . | ··· | . | . | . | . | ··· |

FIG.5

| LEADING-IN POLE ID | ENERGIZATION STATE |
|---|---|
| HH000001 | NORMAL |
| HH000002 | NORMAL |
| HH000003 | ERROR |
| . | . |
| . | . |
| . | . |

FIG.6

| SMART METER ID | LEADING-IN POLE ID | INSTALLATION POSITION (LONGITUDE/LATITUDE) |
|---|---|---|
| SM000001 | HH000001 | x1.xxxxx·yy1.yyyyy |
| SM000002 | HH000002 | x2.xxxxx·yy2.yyyyy |
| SM000003 | HH000003 | x3.xxxxx·yy3.yyyyy |
| . | . | . |
| . | . | . |
| . | . | . |

FIG.7

| SMART METER ID | INSTALLATION POSITION (LONGITUDE/LATITUDE) |
|---|---|
| SM000003 | x3.xxxxx·yy3.yyyyy |

| SMART METER ID | INSTALLATION POSITION (LONGITUDE/LATITUDE) |
| --- | --- |
| SM000002 | x2.xxxxx·yy2.yyyyy |
| SM000003 | x3.xxxxx·yy3.yyyyy |

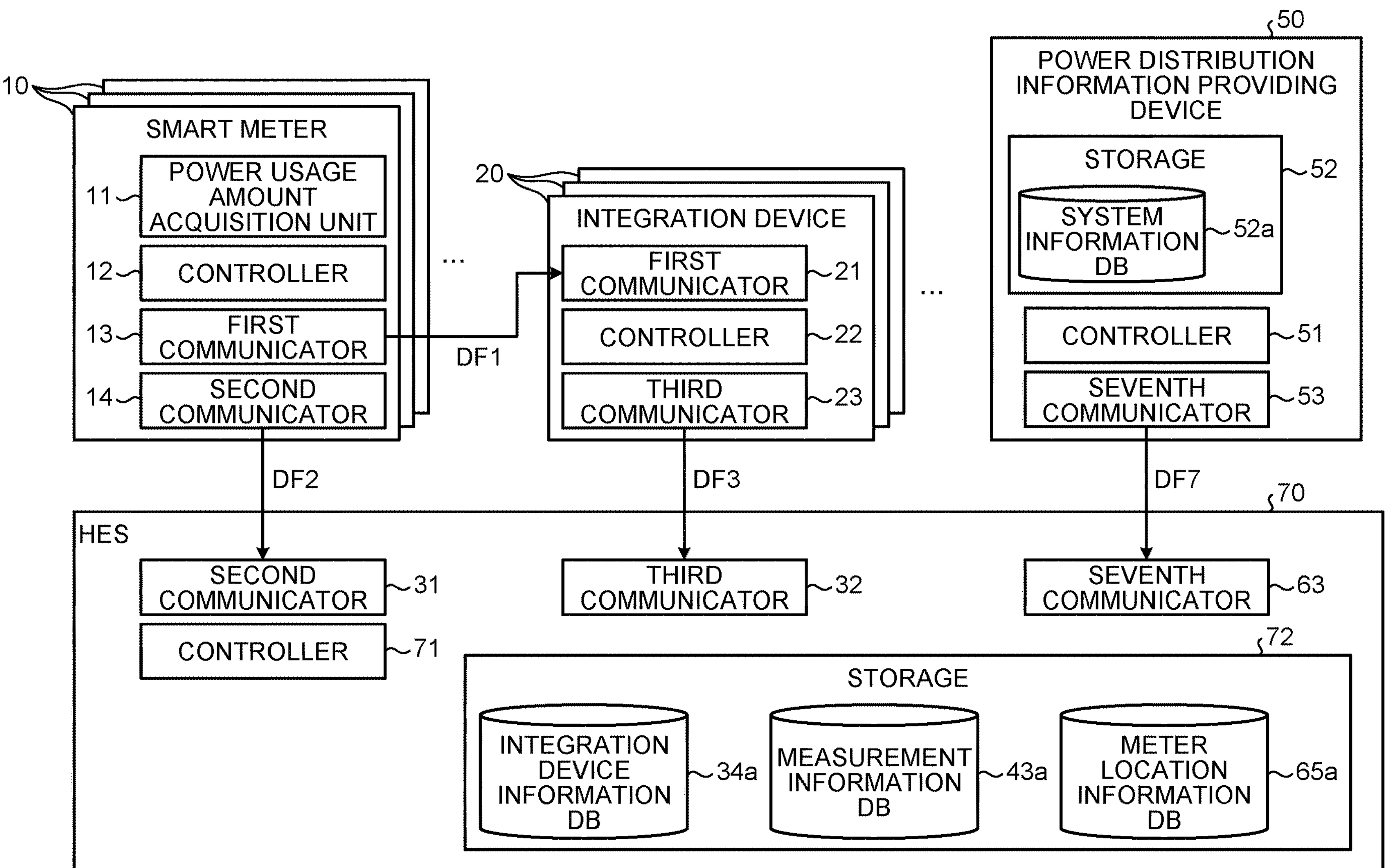
FIG.12
10
SMART METER
11
POWER USAGE AMOUNT ACQUISITION UNIT
12
CONTROLLER
13
FIRST COMMUNICATOR
14
SECOND COMMUNICATOR
DF1
20
INTEGRATION DEVICE
FIRST COMMUNICATOR
21
CONTROLLER
22
THIRD COMMUNICATOR
23
50
POWER DISTRIBUTION INFORMATION PROVIDING DEVICE
STORAGE
52
SYSTEM INFORMATION DB
52a
CONTROLLER
51
SEVENTH COMMUNICATOR
53
DF2
DF3
DF7
70
HES
SECOND COMMUNICATOR
31
THIRD COMMUNICATOR
32
SEVENTH COMMUNICATOR
63
CONTROLLER
71
72
STORAGE
INTEGRATION DEVICE INFORMATION DB
34a
MEASUREMENT INFORMATION DB
43a
METER LOCATION INFORMATION DB
65a

INFORMATION PROCESSING DEVICE AND ANOMALY VISUALIZING SYSTEM

CROSS-REFERENCE TO RELATED APPLICATION

This application claims the benefit of priority from International Patent Application No. PCT/JP2018/041547 filed on Nov. 8, 2018, the entire contents of which are incorporated herein by reference.

BACKGROUND

1. Technical Field

The present disclosure relates to an information processing device and an anomaly visualizing system.

2. Description of the Related Art

There is known the use of a smart meter for detecting occurrence of a power failure in a power distribution system (for example, refer to Japanese Patent Application Laid-open Publication No. 2015-233278 (JP-A-2015-233278)).

In a case in which a function of a smart meter is impaired, a power failure may occur due to stop of electric supply in a system in which a power usage amount is measured by the smart meter. However, with the method disclosed in JP-A-2015-233278, it has been difficult to determine whether the power failure is caused by impairment of the function of the smart meter.

For the foregoing reasons, there is a need for an information processing device and an anomaly visualizing system that can determine a power failure that is caused due to impairment of a function of a smart meter.

SUMMARY

According to an aspect, an information processing device includes: a receiver configured to receive information related to a plurality of smart meters; a controller configured to determine presence or absence of an anomaly in each of the smart meters based on a reception status of the information from each of the smart meters; and an output unit configured to output information indicating presence or absence of an anomaly in each of the smart meters. The receiver receives the information from the smart meters in a cycle of a first predetermined time. The controller determines that an anomaly is occurring in a smart meter from which information has not been obtained for a second predetermined time that is longer than the first predetermined time. The second predetermined time is n times as long as the first predetermined time, and n is equal to or greater than 2.

According to another aspect, an anomaly visualizing system includes: a plurality of smart meters configured to transmit information indicating a power usage amount in a cycle of a first predetermined time; an integration device configured to relay information transmitted from one or more of the smart meters; a relay device configured to store information indicating presence or absence of an anomaly in the integration device; an extraction device configured to extract, based on information from the smart meters, the integration device, or both, a smart meter from which information has not been obtained for a second predetermined time or more, the second predetermined time being longer than the cycle of the first predetermined time; a power distribution information providing device configured to store information indicating presence or absence of an anomaly in a power distribution system connected to a facility the power usage amount of which is detected by the smart meters; an anomaly visualizing device that is provided to be able to communicate with the extraction device and the power distribution information providing device and is configured to output, based on information from the extraction device and the power distribution information providing device, a map image indicating a location of the smart meter in which an anomaly is occurring; a controller configured to determine presence or absence of an anomaly in each of the smart meters based on a reception status of information from each of the smart meters; and an output unit configured to output information indicating presence or absence of an anomaly in each of the smart meters. The anomaly visualizing device includes storage configured to store information indicating locations of the smart meters, and information indicating a correspondence relation between each of the smart meters and the power distribution system, and a controller configured to determine that an anomaly is occurring in a smart meter in a case in which information has not been obtained for the second predetermined time or more from the smart meter configured to detect the power usage amount of the facility connected to the power distribution system having no anomaly. The second predetermined time is n times as long as the first predetermined time, n is equal to or greater than 2, and the controller determines that an anomaly is occurring in a smart meter in a case in which information has not been obtained from the smart meter for the second predetermined time or more and an integration device having no anomaly is interposed in a transmission and reception path for the information related to the smart meter.

BRIEF DESCRIPTION OF THE DRAWINGS

FIG. 2 is a diagram illustrating a configuration example of an integration device information DB;

FIG. 3 is a diagram illustrating a configuration example of a measurement information DB;

FIG. 4 is a diagram illustrating an example of data indicating a reception status of information from each of a plurality of smart meters;

FIG. 5 is a diagram illustrating a configuration example of a system information DB;

FIG. 6 is a diagram illustrating a configuration example of a meter location information DB;

FIG. 7 is a table illustrating an example of a smart meter that is determined to have an anomaly occurring therein based on the data in FIG. 4 and FIG. 6;

FIG. 12 is a block diagram illustrating a principal configuration example of the disaster information visualizing system having a configuration different from that in FIG. 1.

DETAILED DESCRIPTION

Figure 1:
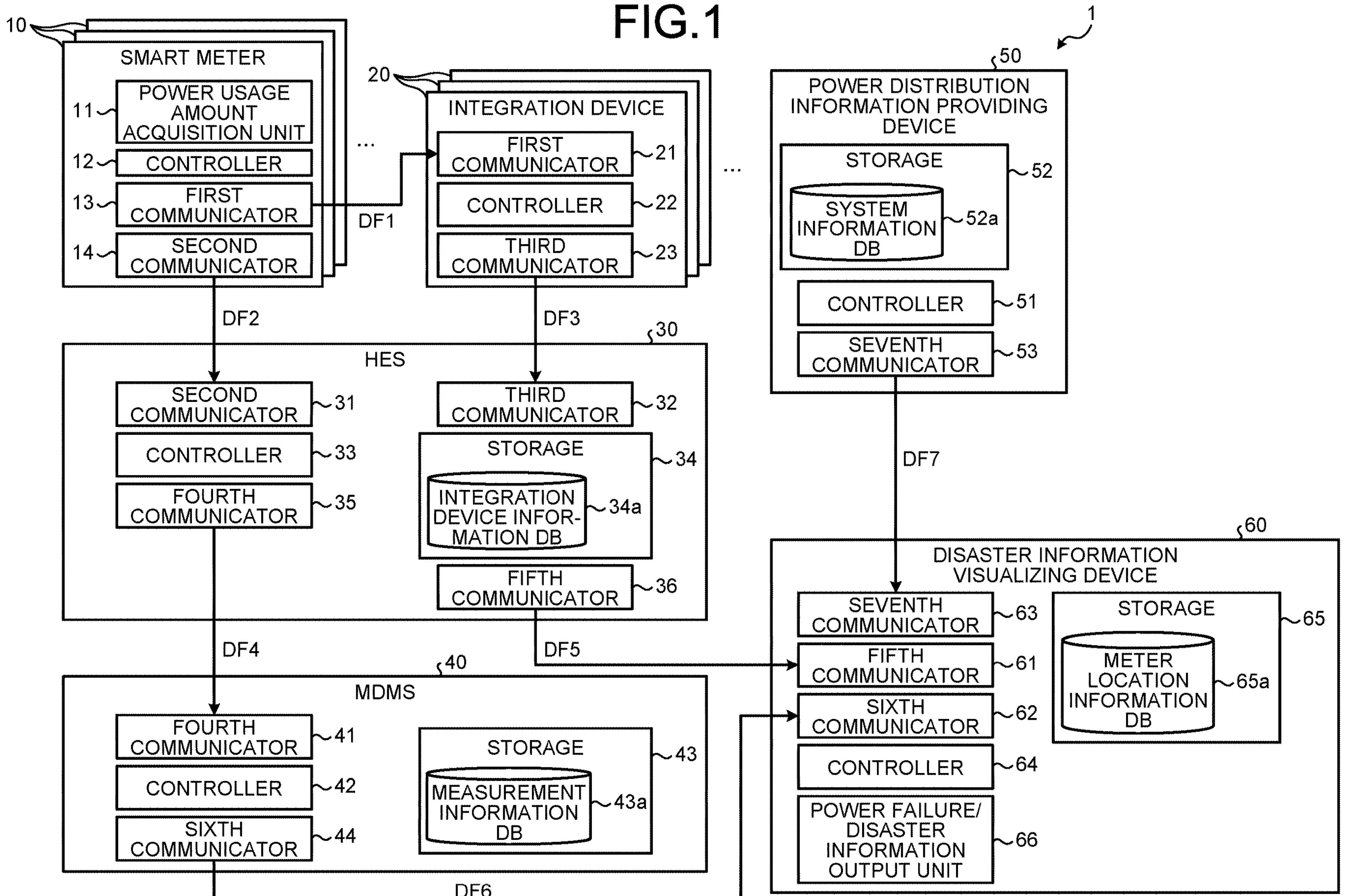
FIG. 1 is a block diagram illustrating a principal configuration example of a disaster information visualizing system according to an embodiment.

The following describes an embodiment of the present disclosure in detail with reference to the drawings. FIG. 1 is a block diagram illustrating a principal configuration example of a disaster information visualizing system 1 according to the embodiment. The disaster information visualizing system 1 includes a plurality of smart meters 10, a plurality of integration devices 20, a Head End System (HES) 30, a Meter Data Management System (MDMS) 40, a power distribution information providing device 50, and a disaster information visualizing device 60. The disaster information visualizing system 1 is an embodiment of an anomaly visualizing system that determines presence or absence of an anomaly in each of the smart meters 10 to output information indicating presence or absence of an anomaly in each of the smart meters 10.

The smart meter 10 is an electric energy meter having a function of measuring a power usage amount of a facility to which electric power is supplied via a power distribution system, and transmitting information indicating the power usage amount via communication. For example, the smart meter 10 is individually provided for its respective contract on the use of electric power, and individually measure a power usage amount of a destination of power supply specified in the contract. Examples of the facility include a house, a factory, and the like, but the facility is not limited thereto, and may be any facility for which a contract can be made for the use of electric power. The smart meter 10 includes a power usage amount acquisition unit 11, a controller 12, a first communicator 13, and a second communicator 14.

The power usage amount acquisition unit 11 includes an input converter that generates a signal at a level corresponding to a voltage and a current flowing through a power supply path in which the smart meter 10 is installed, a multiplication circuit that calculates a power usage amount by multiplication based on the level of the signal, an integration circuit that integrates the power usage amounts calculated by the multiplication circuit, a display that displays the measured power usage amount, and the like. The power usage amount acquisition unit 11 according to the embodiment outputs information indicating the power usage amount obtained by the integrating operation performed by the integration circuit. In the embodiment, the information indicating the power usage amount functions as information related to the smart meter 10. The specific configuration of the power usage amount acquisition unit 11 exemplified herein is merely an example, and the configuration is not limited thereto.

The controller 12 includes a central processing unit (CPU) or an arithmetic circuit similar to the CPU for performing an arithmetic operation, a storage circuit for storing and having a software program and data (hereinafter, referred to as a computer program and the like) loaded therein, which are read out by the arithmetic circuit, and the like. The controller 12 performs various kinds of processing for controlling an operation of the smart meter 10.

The first communicator 13 transmits, to the integration device 20, the information indicating a power usage amount that is output by the power usage amount acquisition unit 11. The first communicator 13 includes a wireless network interface card (WNIC) for communicating with the integration device 20 in a wireless manner. The first communicator 13 transmits the information to the integration device 20 via wireless communication using a wireless local area network (WLAN). FIG. 1 and FIG. 12 (described later) illustrate a data flow DF1 from the first communicator 13 to the integration device 20.

In the embodiment, multi-hop communication can be used in a wireless communication path from the first communicator 13 to the integration device 20. That is, the smart meter 10 is provided to be able to transmit information via another configuration having the same configuration as that of the first communicator 13. Examples of the other configuration include another smart meter 10 different from the smart meter 10 that transmits the information, or another integration device 20 different from the integration device 20 as a transmission target. Employment of a wired communication path as a communication path between the first communicator 13 and the integration device 20 is not excluded. In a case in which the wired communication path can be laid in part of or in the entire communication path between the first communicator 13 and the integration device 20, the wired communication path may be provided.

The second communicator 14 transmits, to the HES 30, the information indicating a power usage amount that is output by the power usage amount acquisition unit 11. A transmission path for information transmitted by the second communicator 14 is an auxiliary transmission path in a case in which transmission of information by the first communicator 13 is not established. The second communicator 14 includes a communication circuit for performing wireless communication that is used as a communication standard for a cellular telephone. The second communicator 14 transmits the information to the HES 30 via the wireless communication using a communication network of a cellular telephone.

FIG. 1 and FIG. 12 illustrate a data flow DF2 from the second communicator 14 to the integration device 20. In the embodiment, a smart meter Identification (ID) (described later) is added to the data that is transmitted or received through the data flow DF1 and the data flow DF2. The smart meter ID is unique identification information that is individually assigned to each of the smart meters 10. The smart meter ID to be added is a smart meter ID assigned to the smart meter 10 as a transmission source. The smart meter ID is held by the storage circuit included in the controller 12, for example.

The controller 12 performs control of a measurement timing for a power usage amount by the power usage amount acquisition unit 11, and control related to transmission of the information indicating a power usage amount using the first communicator 13 and the second communicator 14. In the embodiment, the controller 12 causes the power usage amount acquisition unit 11 to measure a power usage amount in a predetermined cycle (for example, in a cycle of 30 minutes), and transmits the information by the first communicator 13. In a case in which transmission of the information by the first communicator 13 is not established, the controller 12 transmits the information by the second communicator 14.

The integration device 20 receives the information related to the smart meter 10 transmitted from the smart meter 10, and transmits the information to the HES 30. A plurality of smart meters 10 transmit information to one integration device 20. That is, the integration device 20 integrates pieces of information from the plurality of smart meters 10 to be collectively transmitted to the HES 30. In FIG. 1 and FIG. 12, the apparent numbers of the smart meters 10 and the integration devices 20 are the same, but the number of the integration devices 20 is typically smaller than the number of the smart meters 10. The number of the integration devices 20 may be one. In this way, the integration device 20 relays the pieces of information transmitted from one, some, or all of the smart meters 10.

The integration device 20 includes a first communicator 21, a controller 22, and a third communicator 23. The first communicator 21 has a configuration that is functionally similar to that of the first communicator 13, and receives the pieces of information transmitted from the smart meters 10. The controller 22 has a configuration that is functionally similar to that of the controller 12, and performs various kinds of processing for controlling an operation of the integration device 20. The third communicator 23 has a configuration that is functionally similar to that of the first communicator 13. The third communicator 23 transmits the information received by the first communicator 21 to the HES 30 under the control of the controller 22. The pieces of information from the smart meters 10 received by the first communicator 21 indicate power usage amounts individually measured by the smart meters 10. The controller 22 performs processing of integrating the power usage amounts individually measured by the smart meters 10, and causing the third communicator 23 to transmit the integrated data.

Information indicating at least one of a transmission time and a reception time of the information from the smart meter 10 is individually added to the integrated data. At the time when the information is transmitted by the first communicator 13, the transmission time of the information from the smart meter 10 may be added to the information, the reception time of the information from the smart meter 10 may be added by the controller 22, or both of the transmission time and the reception time may be added. Even when the pieces of information are integrated by the controller 22, a correspondence among the individual smart meter ID, the power usage amount, and at least one of the transmission time and the reception time of the information is maintained.

FIG. 1 and FIG. 12 illustrate a data flow DF3 from the third communicator 23 to the HES 30. In the embodiment, an integration device ID is added to the data that is transmitted and received through the data flow DF3. The integration device ID is unique identification information that is individually assigned to each of the integration devices 20. The integration device ID to be added is the integration device ID assigned to the integration device 20 as a transmission source. The integration device ID is held by a storage circuit included in the controller 22, for example.

A functionally similar configuration is such that the same function can be exhibited, and processing capacity, a specific circuit configuration, and the like are not necessarily the same. The processing capacity herein means a processing speed, a communication speed, a communicable range, and the like. A controller such as the controller 12 and the controller 22 is not related to the communication speed and the communicable range.

The HES 30 integrates the pieces of information transmitted from the integration devices 20 to be transmitted to the MDMS 40. The HES 30 also stores and holds pieces of information related to the integration devices 20. The HES 30 includes a second communicator 31, a third communicator 32, a controller 33, storage 34, a fourth communicator 35, and a fifth communicator 36.

The second communicator 31 has a configuration that is functionally similar to that of the second communicator 14, and receives information that is transmitted from the smart meter 10 by the second communicator 14. The information received by the second communicator 31 indicates the power usage amount measured by the smart meter 10. The third communicator 32 has a configuration that is functionally similar to those of the first communicator 13 and the third communicator 23, and receives information that is transmitted from the integration device 20 by the third communicator 23. The information received by the third communicator 32 indicates the power usage amounts that are individually measured by the smart meters 10 and integrated by the controller 22.

The controller 33 has a configuration that is functionally similar to those of the controller 12 and the controller 22, and performs various kinds of processing for controlling an operation of the HES 30. The storage 34 includes a storage device that stores information by which the HES 30 functions as an integration device information database (DB) 34*a*.

FIG. 2 is a diagram illustrating a configuration example of the integration device information DB 34*a*. A record of the integration device information DB 34*a* includes pieces of information corresponding to a plurality of items (columns) such as the integration device ID, an information acquisition time, and history information. FIG. 2 exemplifies the items of the integration device ID, the information acquisition time, and the history information, but the integration device information DB 34*a* may include additional items.

The information registered in the item of the integration device ID is the integration device ID that is individually assigned to each of the integration devices 20. FIG. 2 exemplifies "SS000001", "SS000002", and "SS000003", which are pieces of identification information assigned to the different integration devices 20.

The information registered in the item of the information acquisition time indicates a time at which the information is received by the second communicator 31 from the integration device 20. In FIG. 2, the western calendar, year (yyyy)/month (mm)/date (dd)/time (tt)/minute (mm), is employed as a format of the information acquisition time, but the format is not limited thereto. Seconds and decimal seconds may further be included therein.

The information registered in the item of the history information indicates whether the information from the integration device 20 is normally received by the second communicator 31. In FIG. 2, "normal" is registered in the item of the history information in a case in which the HES 30 normally receives, at the time registered in the item of the information acquisition time, the information from the integration device 20 to which the identification information registered in the item of the integration device ID is assigned; and "error" is registered in the other cases. In the embodiment, the information is transmitted from the smart meter 10 in a cycle of 30 minutes, so that the information acquisition time is also set in a cycle of 30 minutes.

A row of record including one integration device ID, one information acquisition time, and one piece of history information in the integration device information DB 34*a* illustrated in FIG. 2 indicates a reception status of the information at the information acquisition time from the integration device 20 to which the integration device ID is assigned. The integration device information DB 34*a* indicates a plurality of the records. In the integration device information DB 34*a*, a plurality of the records including the same integration device ID indicate reception statuses of pieces of information at different information acquisition times.

The controller 33 sets the time at which the information is received by the third communicator 32 as the information acquisition time and performs processing of associating the integration device added to the information with the reception status of the information and registering them in the integration device information DB 34*a* as a record. The controller 33 also performs processing of integrating the power usage amounts that are individually measured by the smart meters 10 and received by the second communicator 31 and the third communicator 32, and causing the fourth communicator 35 to transmit the integrated data. In a manner similar to the integration performed by the controller 22, information indicating at least one of the transmission time and the reception time of the information from the smart meter 10 is individually added to the data integrated by the controller 33. Even when the information is integrated by the controller 33, association among the individual smart meter ID, the power usage amount, and at least one of the transmission time and the reception time of the information is maintained.

The fourth communicator 35 transmits, to the MDMS 40, pieces of information indicating the power usage amounts that are individually measured by the smart meters 10 and received by the second communicator 31 and the third communicator 32. The fourth communicator 35 has a configuration including a communication circuit for communicating with the MDMS 40 such as a Network Interface Card (NIC), for example, and transmits the information to the MDMS 40 via a communication line that is provided between the fourth communicator 35 and the MDMS 40. FIG. 1 illustrates a data flow DF4 from the fourth communicator 35 to the MDMS 40. In this way, in the embodiment, the HES 30 functioning as a relay device that stores information indicating presence or absence of an anomaly in the integration device 20 is interposed in a transmission and reception paths for the information related to the smart meters 10.

The fifth communicator 36 transmits part or all of the pieces of information registered in the integration device information DB 34*a* to the disaster information visualizing device 60. The fifth communicator 36 has a configuration including a communication circuit for communicating with the disaster information visualizing device 60 such as an NIC, for example, and transmits information to the disaster information visualizing device 60 via a communication line provided between the fifth communicator 36 and the disaster information visualizing device 60. The controller 33 performs processing of causing the fifth communicator 36 to transmit part or all of the pieces of information registered in the integration device information DB 34*a*. In a case of transmitting part of the pieces of information registered in the integration device information DB 34*a*, the controller 33 extracts the information on a record in which the history information is "error", and causes the fifth communicator 36 to transmit the information. FIG. 1 illustrates a data flow DF5 from the fifth communicator 36 to the disaster information visualizing device 60.

The controller 33 may check whether the pieces of information from all of the smart meters 10 are obtained based on the information received by the third communicator 32. In this case, the HES 30 holds setting information including the smart meter IDs of all of the smart meters 10 and transmission information for the second communicators 14 of the smart meters 10 to which the smart meter IDs are assigned. The setting information may be stored in a storage circuit of the controller 33, may be stored in the storage 34, or may be stored in another storage device or storage circuit (not illustrated) included in the HES 30. The controller 33 checks whether the information is transmitted from the integration device 20 and checks, in a case in which the information is transmitted from the integration device 20, whether information indicating the power usage amounts associated with the respective smart meter IDs of all of the smart meters 10 is included therein. In a case in which there is the smart meter ID of the smart meter 10 the information of which is not obtained, or the smart meter ID the information of which indicating the power usage amount is unreadable due to a corruption and the like in the information from the integration device 20, the second communicator 31 performs a transmission for requesting information to the second communicator 14 of the smart meter 10 to which the smart meter ID is assigned. The smart meter 10 transmits the information indicating the power usage amount via the second communicator 14 in response to the transmission.

The MDMS 40 stores and holds the pieces of information related to the smart meters 10 transmitted from the HES 30. The MDMS 40 transmits part or all of the pieces of information related to the smart meters 10 to the disaster information visualizing device 60. The MDMS 40 includes a fourth communicator 41, a controller 42, storage 43, and a sixth communicator 44.

The fourth communicator 41 has a configuration that is functionally similar to that of the fourth communicator 35, and receives the information transmitted from the HES 30. The controller 42 has a configuration that is functionally similar to those of the controller 12, the controller 22, and the controller 33, and performs various kinds of processing for controlling an operation of the MDMS 40. The storage 43 includes a storage device that stores information by which the MDMS 40 functions as a measurement information DB 43*a*.

FIG. 3 is a diagram illustrating a configuration example of the measurement information DB 43*a*. A record of the measurement information DB 43*a* includes pieces of information corresponding to a plurality of items (columns) such as the smart meter ID, the information acquisition time, and the indication number. FIG. 3 exemplifies the items of the smart meter ID, the information acquisition time, and the indication number, but the measurement information DB 43*a* may include additional items.

The information registered in the item of the smart meter ID is the smart meter ID that is individually assigned to each of the smart meters 10. FIG. 3 exemplifies "SM000001", "SM000002", and "SM000003", which are pieces of identification information assigned to the different smart meters 10.

The information registered in the item of the information acquisition time indicates a time at which the information is received by the fourth communicator 41 from the HES 30, for example. In FIG. 3, the western calendar, year (yyyy)/month (mm)/date (dd)/time (tt)/minute (mm), is employed as a format of the information acquisition time, but the format is not limited thereto. Seconds and decimal seconds may further be included therein. The information registered in the item of the information acquisition time may be at least one of the transmission time and the reception time of the information from the smart meter 10 that is added to the information integrated by the controller 22 and the controller 33.

The information registered in the item of the indication number is a numerical value indicating the power usage amount. In the embodiment, the power usage amount is represented by a numerical value of the indication number. In FIG. 3, "normal" is registered in the item of the indication number in a case in which the MDMS 40 normally receives, via the integration device 20 and the HES 30 (or only the HES 30), the indication number included in the information from the smart meter 10 to which the identification information registered in the item of the smart meter ID is assigned; and "error" is registered therein in the other cases. In the embodiment, the information is transmitted from the smart meter 10 in a cycle of 30 minutes, so that the information acquisition time is also set in a cycle of 30 minutes.

As an example of a case in which "error" is registered in the item of the indication number, exemplified is a case in which the information from the smart meter 10 included in the information received by the MDMS 40 from the HES 30 is in a state that is inappropriate for a predetermined format of the indication number (numerical value information) due to a data corruption and the like. In this case, if the smart meter ID added to the information from the smart meter 10 is in a state of being able to be appropriately read, the controller 42 associates the smart meter ID, the information acquisition time of the information from the smart meter 10, and "error" with each other to register them as a record in the measurement information DB 43*a*.

As another example of a case in which "error" is registered in the item of the indication number, exemplified is a case in which the information is registered as a record of the smart meter ID that is not included in the information received by the MDMS 40 from the HES 30. That is, in a case in which the information indicating the power usage amount that should be transmitted from the smart meter 10 in a predetermined cycle is not transmitted from the smart meter 10, or a case in which the transmission of the information is performed but the transmission and reception of the information fails, the information received from the HES 30 does not include the information associated with the smart meter ID of the smart meter 10. In this case, the controller 42 associates the smart meter ID, the information acquisition time of the cycle, and "error" with each other to register them as a record in the measurement information DB 43*a*. To handle this case, the MDMS 40 holds the setting information indicating the smart meter IDs of all of the smart meters 10 that transmit the information, and a time (a time registered as the information acquisition time) corresponding to the cycle in which the information is transmitted from the smart meter 10. The setting information may be stored in a storage circuit of the controller 42, may be stored in the storage 43, or may be stored in another storage device or storage circuit (not illustrated) included in the MDMS 40. After receiving the information from the HES 30 by the fourth communicator 41, the controller 42 checks whether the information from the HES 30 includes the pieces of information from the smart meter IDs of all of the smart meters 10 that transmit the information. In a case in which the smart meter ID not included in the information from the HES 30 is found, the found smart meter ID, the information acquisition time corresponding to the cycle in which the smart meter ID is found, and "error" are associated with each other to be registered as a record in the measurement information DB 43*a*.

FIG. 4 is a diagram illustrating an example of data indicating a reception status of the information from each of the smart meters 10. Content of the data in FIG. 4 corresponds to the measurement information DB 43*a* illustrated in FIG. 3. Actually, regarding a time before 7:30 and a time after 9:00, the information from the smart meter 10 is similarly subjected to transmission and reception processing and registered in the measurement information DB 43*a*.

In a case of the example illustrated in FIG. 4, indication numbers of "030467", "030468", "030469", and "030470" are normally obtained from the smart meter 10 assigned the smart meter ID of "SM000001", at respective timings of 7:30, 8:00, 8:30, and 9:00 on Apr. 1, 2018. That is, transmission and reception of the information indicating the power usage amounts are normally performed by the smart meter 10 assigned the smart meter ID of "SM000001", in a cycle of 30 minutes from 7:30 to 9:00 on Apr. 1, 2018.

The indication number of "022160" is normally obtained at the timing of 7:30 on Apr. 1, 2018 from the smart meter 10 to which the smart meter ID of "SM000002" is assigned. That is, at the timing of 7:30 on Apr. 1, 2018, transmission and reception of the information indicating the power usage amount is normally performed by the smart meter 10 to which the smart meter ID of "SM000002" is assigned. On the other hand, the indication number is "error" at each of the timings of 8:00, 8:30, and 9:00. That is, in a period from 8:00 to 9:00 on Apr. 1, 2018, the information indicating the power usage amount is not transmitted from the smart meter 10 to which the smart meter ID of "SM000001" is assigned, or the transmission of the information is performed but the transmission and reception of the information fails.

The indication number that is "error" is obtained at each of the timings of 7:30, 8:00, 8:30, and 9:00 on Apr. 1, 2018 from the smart meter 10 to which the smart meter ID of "SM000003" is assigned. That is, in a period from 7:30 to 9:00 on Apr. 1, 2018, the information indicating the power usage amount is not transmitted from the smart meter 10 to which the smart meter ID of "SM000001" is assigned, or the transmission of the information is performed but the transmission and reception of the information fails.

The sixth communicator 44 transmits, to the disaster information visualizing device 60, part or all of the pieces of information registered in the measurement information DB 43*a*. The sixth communicator 44 has a configuration including a communication circuit for communicating with the disaster information visualizing device 60 such as an NIC, for example, and transmits information to the disaster information visualizing device 60 via a communication line that is provided between the sixth communicator 44 and the disaster information visualizing device 60. The controller 42 performs processing of causing the sixth communicator 44 to transmit part or all of the pieces of information registered in the measurement information DB 43*a*. In a case of transmitting part of the pieces of information registered in the measurement information DB 43*a*, the controller 42 extracts the information on a record in which the indication number is "error", and causes the sixth communicator 44 to transmit the information. FIG. 1 illustrates a data flow DF6 from the sixth communicator 44 to the disaster information visualizing device 60.

The power distribution information providing device 50 stores information indicating presence or absence of an anomaly in a power distribution system that is connected to a facility the power usage amount of which is detected by the smart meters 10. The power distribution information providing device 50 includes a controller 51, storage 52, and a seventh communicator 53.

The controller 51 has a configuration that is functionally similar to those of the controller 12, the controller 22, the controller 33, and the controller 42, and performs various kinds of processing for controlling an operation of the power distribution information providing device 50. The storage 52 includes a storage device that stores information by which the power distribution information providing device 50 functions as a system information DB 52*a*.

FIG. 5 is a diagram illustrating a configuration example of the system information DB 52*a*. A record of the system information DB 52*a* includes pieces of information corresponding to a plurality of items (columns) such as a leading-in pole ID and an energization state. FIG. 5 exemplifies the items of the leading-in pole ID and the energization state, but the system information DB 52*a* may include additional items.

The information registered in the item of the leading-in pole ID is identification information that is individually assigned to each of a plurality of the leading-in poles. The leading-in pole herein is what is called an electric wire leading-in pole that is provided in the power distribution system and functions as a configuration for supplying electric power. FIG. 2 exemplifies "HH000001", "HH000002", and "HH000003", which are pieces of the identification information assigned to different leading-in poles.

The information registered in the item of the energization state indicates whether energization via the leading-in pole is normally performed. For example, in the example illustrated in FIG. 5, energization is normally performed in the leading-in poles to which the leading-in pole IDs of "HH000001" and "HH000002" are respectively assigned, so that energization states of records associated with these leading-in pole IDs are "normal". On the other hand, energization is not normally performed in the leading-in pole to which the leading-in pole ID of "HH000003" is assigned, so that the energization state of the record associated with the leading-in pole ID is "error". In this way, the system information DB 52*a* can be used as information indicating presence or absence of an anomaly in the power distribution system that is connected to the facility the power usage amount of which is detected by the smart meters 10.

The seventh communicator 53 transmits, to the disaster information visualizing device 60, part or all of the pieces of information registered in the system information DB 52*a*. The seventh communicator 53 has a configuration including a communication circuit for communicating with the disaster information visualizing device 60 such as an NIC, for example, and transmits information to the disaster information visualizing device 60 via a communication line that is provided between the seventh communicator 53 and the disaster information visualizing device 60. The controller 51 performs processing of causing the seventh communicator 53 to transmit part or all of the pieces of information registered in the system information DB 52*a*. In a case of transmitting part of the pieces of information registered in the system information DB 52*a*, the controller 51 extracts the information on the record in which the energization state is "error", and causes the seventh communicator 53 to transmit the information. FIG. 1 illustrates a data flow DF7 from the seventh communicator 53 to the disaster information visualizing device 60.

The communication line used in the data flow DF4, the data flow DF5, the data flow DF6, and the data flow DF7 may be a local area network (LAN), or may be a public communication line network such as the Internet. A form of the communication line may be any of a wired form and a wireless form. The form may be the wired form, the wireless form, or a combination of the wired form and the wireless form. Forms of communication lines respectively used in the data flow DF4, the data flow DF5, the data flow DF6, and the data flow DF7 may be individual forms, or part or all of the forms may be common.

The disaster information visualizing device 60 is an information processing device that outputs information indicating presence or absence of an anomaly in each of the smart meters 10. The disaster information visualizing device 60 includes a fifth communicator 61, a sixth communicator 62, a seventh communicator 63, a controller 64, storage 65, and a power failure/disaster information output unit 66.

The fifth communicator 61 has a configuration that is functionally similar to that of the fifth communicator 36, and receives the information transmitted from the HES 30. The sixth communicator 62 has a configuration that is functionally similar to that of the sixth communicator 44, and receives the information transmitted from the MDMS 40. The seventh communicator 63 has a configuration that is functionally similar to that of the seventh communicator 53, and receives the information transmitted from the power distribution information providing device 50.

The controller 64 has a configuration that is functionally similar to those of the controller 12, the controller 22, the controller 33, the controller 42, and the controller 51, and performs various kinds of processing for controlling an operation of the disaster information visualizing device 60. The storage 65 includes a storage device that stores information by which the disaster information visualizing device 60 functions as a meter location information DB 65*a*.

FIG. 6 is a diagram illustrating a configuration example of the meter location information DB 65*a*. A record of the meter location information DB 65*a* includes information corresponding to a plurality of items (columns) such as the smart meter ID, the leading-in pole ID, and an installation position. FIG. 6 exemplifies the items of the smart meter ID, the leading-in pole ID, and the installation position, but the integration device information DB 34*a* may include additional items.

The information registered in the item of the smart meter ID in the meter location information DB 65*a* is the smart meter ID that is individually assigned to each of the smart meters 10 in a manner similar to the same item of the measurement information DB 43*a*. The information registered in the item of the leading-in pole ID in the meter location information DB 65*a* is the identification information that is individually assigned to each of the leading-in poles in a manner similar to the same item in the system information DB 52*a*.

The information registered in the item of the installation position indicates a position at which the smart meter 10 is installed. FIG. 6 exemplifies a case in which the position at which the smart meter 10 is installed is represented by latitude and longitude, but the embodiment is not limited thereto. A specific format of the information is not limited so long as the position at which the smart meter 10 is installed can be specified by the information.

The smart meter ID of the smart meter 10, the leading-in pole ID of the leading-in pole used in the power distribution system in which the power usage amount is measured by the smart meter 10 assigned the smart meter ID, and the installation position of the smart meter 10 assigned the smart meter ID are associated with each other by one record included in the meter location information DB 65*a*. The power distribution system in which the power usage amount is measured by the smart meter 10 assigned the smart meter ID of "SM000001", includes the leading-in pole to which the leading-in pole ID of "HH000001" is assigned, and is installed at "latitude x1.xxxxx, longitude yy1.yyyyy", for example. In this way, the meter location information DB 65*a* including the installation position can be used as information indicating locations of the smart meters 10. That is, the storage 65 stores the information indicating the locations of the smart meters 10.

The controller 64 determines presence or absence of an anomaly in each of the smart meters 10 based on the reception status of the information from each of the smart meters 10. Specifically, by receiving the information transmitted from the sixth communicator 44 by the sixth communicator 62, the controller 64 acquires part or all of the pieces of information indicating the power usage amounts transmitted from the respective smart meters 10. The controller 64 determines presence or absence of an anomaly in each of the smart meters 10 based on information on the record in which the indication number is “error” among the acquired pieces of information.

In the embodiment, it is determined that an anomaly is occurring in the smart meter 10 from which information has not been obtained for a second predetermined time or more. In this case, the second predetermined time is n times as long as a time (for example, 30 minutes) corresponding to the predetermined cycle (for example, the cycle of 30 minutes). n is equal to or larger than 2. n may be an integer value or may include values in decimal places. In this way, “first predetermined time” in the embodiment is a time corresponding to the predetermined cycle. The following exemplarily describes determination of presence or absence of an anomaly in each of the smart meters 10 performed by the controller 64 with reference to FIG. 4, FIG. 7, and FIG. 8.

FIG. 7 is a table illustrating an example of the smart meter 10 that is determined to have an anomaly occurring therein based on the data in FIG. 4 and FIG. 6. In a case of n=3, the controller 64 determines that an anomaly is occurring in the smart meter 10 from which information has not been obtained for 30 minutes×3=90 minutes (one hour and a half) or more. In FIG. 4, at 9:00 on Apr. 1, 2018, the smart meter ID the indication number of which has been “error” from 7:30, that is, 90 minutes before, is “SM000003”. Due to this, in a case of n=3, at 9:00 on Apr. 1, 2018, the controller 64 determines that an anomaly is occurring in the smart meter 10 assigned the smart meter ID of “SM000003”.

The controller 64 reads out the installation position associated with the smart meter ID of the smart meter 10 that is determined to have an anomaly occurring therein, from the information that is transmitted from the power distribution information providing device 50 and received by the seventh communicator 63. The controller 64 extracts, as the information on the smart meter 10 in which an anomaly is occurring, the smart meter ID of the smart meter 10 that is determined to have an anomaly occurring therein and the installation position associated with the smart meter ID.

On the other hand, the controller 64 determines, to be functioning normal, the smart meters 10 assigned the respective smart meter IDs of “SM000001” and “SM000002” the indication numbers of which are normally registered at 7:30 on Apr. 1, 2018.

Figures 8, 9:
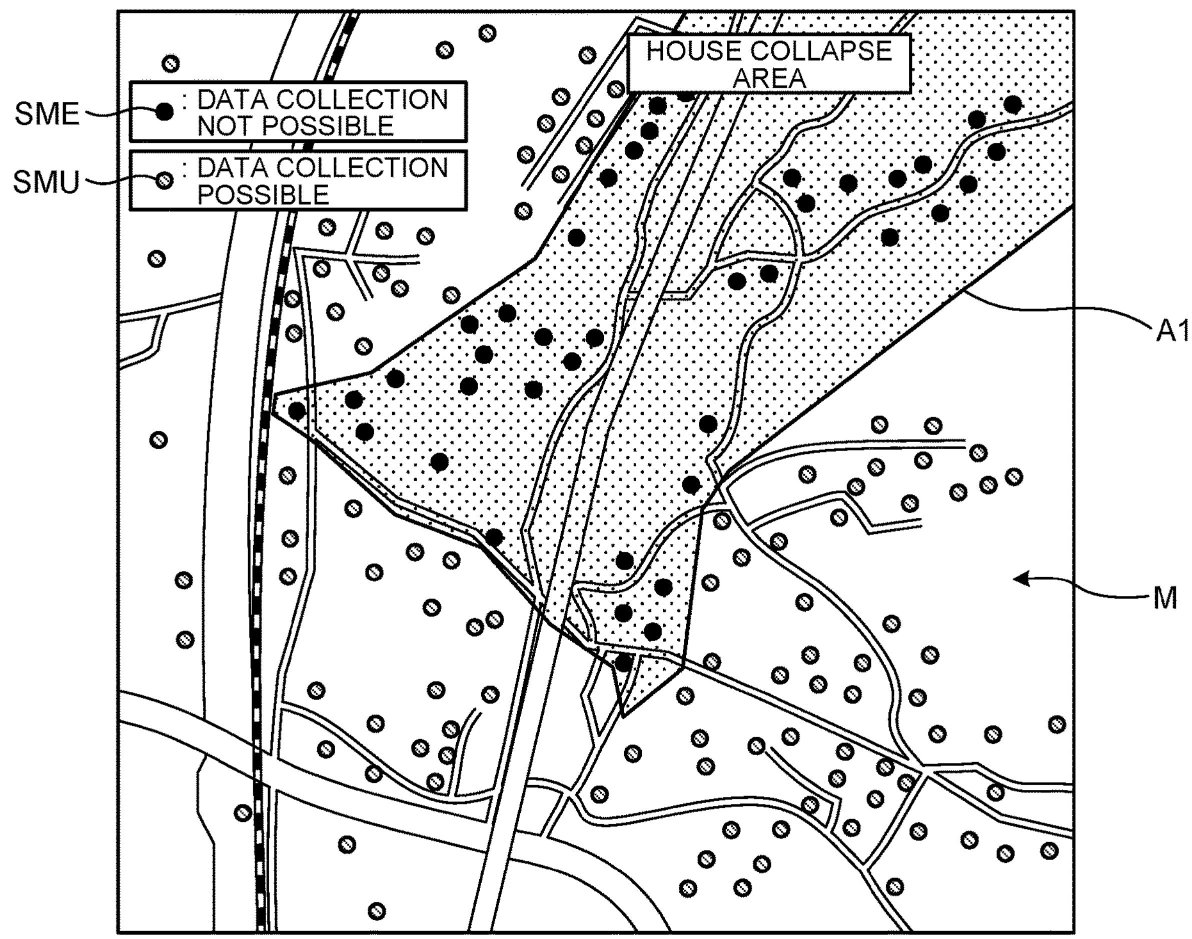
FIG. 8 is a table illustrating another example of the smart meter that is determined to have an anomaly occurring therein based on the data in FIG. 4 and FIG. 6.
FIG. 9 is a diagram illustrating an output example of information indicating presence or absence of an anomaly in each of the smart meters.

FIG. 8 is a table illustrating another example of the smart meter 10 that is determined to have an anomaly occurring therein based on the data in FIG. 4 and FIG. 6. In a case of n=2, the controller 64 determines that an anomaly is occurring in the smart meter 10 from which information has not been obtained for 30 minutes×2=60 minutes (one hour) or more. In FIG. 4, at 9:00 on Apr. 1, 2018, the smart meter IDs the indication number of which has been “error” from 8:00, that is, 60 minutes before 9:00, are “SM000002” and “SM000003”. Due to this, in a case of n=2, at 9:00 on Apr. 1, 2018, the controller 64 determines that an anomaly is occurring in the smart meters 10 to which the smart meter IDs of “SM000002” and “SM000003” are assigned. As described above, the controller 64 extracts the smart meter IDs of the smart meters 10 that are determined to have an anomaly occurring therein, and installation positions associated with the smart meter IDs.

On the other hand, the controller 64 determines, to be functioning normal, the smart meter 10 assigned the smart meter ID of “SM000001” the indication number of which is normally registered at 8:00 on Apr. 1, 2018.

Although not illustrated, if the indication numbers associated with the smart meter IDs of “SM000002” and “SM000003” are still “error” at 9:30 on Apr. 1, 2018, the controller 64 obtains a determination result as illustrated in FIG. 8 even in a case of n=3. By setting n to be larger, it is possible to extract, with higher accuracy, the smart meters 10 that are more likely to have ongoing anomalies.

FIG. 9 is a diagram illustrating an output example of the information indicating presence or absence of an anomaly in each of the smart meters 10. The power failure/disaster information output unit 66 functions as an output unit that outputs the information indicating presence or absence of an anomaly in each of the smart meters 10. The power failure/disaster information output unit 66 according to the embodiment outputs a map image indicating the locations of the smart meters 10 in which anomalies are occurring as illustrated in FIG. 9, for example. Map image data used for the output may be map image data that can be acquired from the outside using a communication network such as the Internet, or may be map image data that is stored in the storage circuit included in the controller 64, the storage 65, or another storage device (not illustrated).

In FIG. 9, the positions of smart meters 10 that are determined to have an anomaly occurring therein are indicated in the map image as black dot SMEs indicating the smart meters 10 of “data collection not possible”. In FIG. 9, the positions of normal smart meters 10 that are not determined to have an anomaly occurring therein are indicated in the map image as mask dot SMUs indicating the smart meters 10 of “data collection possible”. The installation position in the meter location information DB 65*a* is referred, whereby the position of each of the smart meters 10 is indicated in the map image. In this way, the disaster information visualizing device 60 according to the embodiment functions as an anomaly visualizing device that outputs the map image indicating the locations of the smart meters 10 in which anomalies are occurring.

In the embodiment, the controller 64 reads out the installation positions of the respective smart meters 10 from the meter location information DB 65*a* to specify points corresponding to the positions of the respective smart meters 10 in the map image. The controller 64 generates the map image in which, among the specified points, the points corresponding to the positions of the smart meters 10 that are determined to have an anomaly occurring therein are illustrated by black dots SME, and the points corresponding to the positions of the other smart meters 10 are illustrated by mask dots SMU.

In the embodiment, the power failure/disaster information output unit 66 includes a display device that outputs the map image generated by the controller 64, for example. The power failure/disaster information output unit 66 displays the map image. The power failure/disaster information output unit 66 may include a communication device that distributes the map image to be displayed on an external display device.

Figure 10:
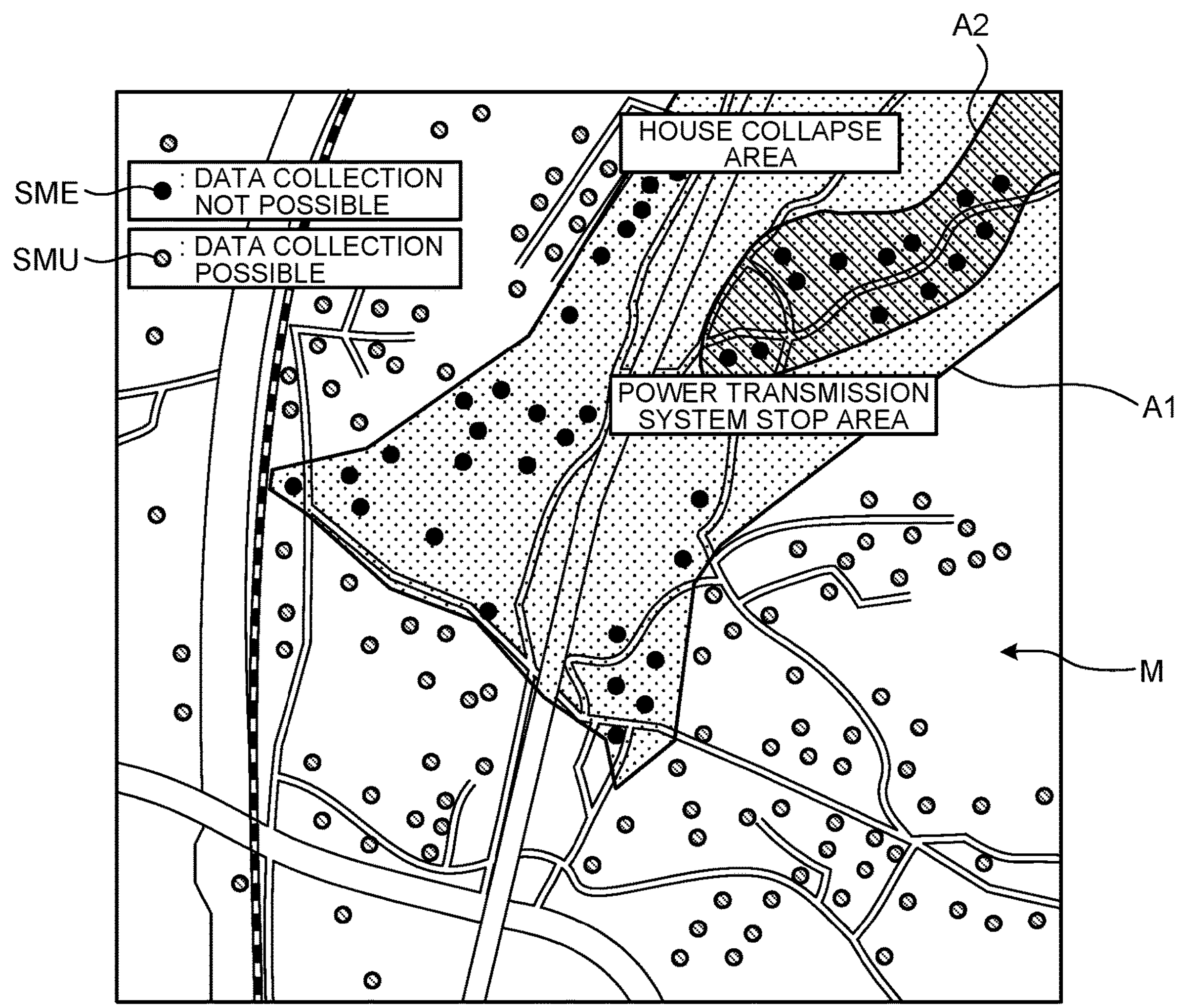
FIG. 10 is a diagram illustrating an output example of information indicating a relation between presence or absence of an anomaly in each of the smart meters and a state of a power distribution system.

In the embodiment, the smart meter 10 that is determined to have an anomaly occurring therein is handled as being provided in a house collapse area due to a disaster such as an earthquake, a fire, and the like. Thus, in the example illustrated in FIG. 9, a boundary line of a house collapse area A1 runs along a boundary line between the black dots SME and the mask dots SMU. The black dots SME are present inside the house collapse area A1, and the mask dots SMU are present outside the house collapse area A1. This is because the smart meters 10 from which information has not been obtained for the second predetermined time or more are likely to have been involved in the collapse of a house caused by the disaster and damaged or washed away, for example, resulting in the loss of function. In a case of detecting occurrence of a disaster, the controller 64 may handle the smart meter 10 from which information has not been obtained for the second predetermined time or more as the smart meter 10 that has lost the function due to the disaster, and perform an output as illustrated in FIG. 9 or FIG. 10 (described later). In this case, the disaster information visualizing device 60 includes a communicator that can acquire information from a disaster detection alarm system such as an earthquake detection alarm system and a fire detection alarm system (not illustrated). In a case in which information indicating occurrence of a disaster is acquired via the communicator, presence or absence of an anomaly in each of the smart meters 10 is determined based on the reception status of the information from each of the smart meters 10.

Another condition for determining that an anomaly is occurring in the smart meter 10 may further be added. For example, the smart meter 10 in which an anomaly is occurring may be determined by additionally using information related to presence or absence of an anomaly in the power distribution system. In this case, the power failure/disaster information output unit 66 may output information indicating a relation between presence or absence of an anomaly in the power distribution system and presence or absence of an anomaly in each of the smart meters 10. In this case, the seventh communicator 63 functions as an acquisition unit that acquires information indicating presence or absence of an anomaly in the power distribution system that is connected to the facility the power usage amount of which is detected by the smart meters 10. The meter location information DB 65*a* functions as information indicating a correspondence relation between each of the smart meters 10 and the power distribution system.

FIG. 10 is a diagram illustrating an output example of information indicating a relation between presence or absence of an anomaly in each of the smart meters 10 and a state of the power distribution system. In the example illustrated in FIG. 10, the leading-in pole ID the energization state of which is "error" is extracted from the information that is transmitted from the power distribution information providing device 50 and received by the seventh communicator 63. The controller 64 generates a map image in such a display manner that a power transmission system stop area A2 encompasses the smart meter 10 assigned the smart meter ID associated with the extracted leading-in pole ID in the meter location information DB 65*a*. With this operation, it is suggested that, at the black dots SME encompassed by the power transmission system stop area A, the transmission and reception of the information indicating the power usage amount may be allowed because of an anomaly in the power distribution system, not limited to an anomaly in the smart meter 10.

An example of using the information related to presence or absence of an anomaly in the power distribution system as the condition for determining that an anomaly is occurring in the smart meter 10 is not limited to the example illustrated in FIG. 10. For example, the controller 64 may cause the smart meter 10 assigned the smart meter ID associated with the leading-in pole ID the energization state of which is "error" in the meter location information DB 65*a*, to be displayed on the map image as a dot having appearance different from that of the black dot SME. That is, the smart meter 10 assigned the smart meter ID associated with the leading-in pole ID the energization state of which is "error" in the meter location information DB 65*a*, may be distinguished from the smart meter 10 that is determined to have an anomaly occurring therein. In other words, the controller 64 may determine that an anomaly is occurring in the smart meter 10 in a case in which the information has not been obtained for the second predetermined time or more from the smart meter 10 configured to detect the power usage amount of the facility connected to the power distribution system (for example, the leading-in pole) in which an anomaly is not occurring.

The controller 64 may determine that an anomaly is occurring in a smart meter 10 in a case where information has not been obtained from the smart meter 10 for the second predetermined time or more and the integration device 20 having no anomaly is interposed in the transmission and reception path for the information related to the smart meter 10. In this case, for example, "integration device ID" is further added as the item of the meter location information DB 65*a*. The information registered in the item of "integration device ID" in the meter location information DB 65*a* is the integration device ID assigned to the integration device 20 through which the smart meter 10 transmits information. That is, a normal route of the integration device 20 through which the smart meter 10 transmits information is determined in advance, and the smart meter 10 is determined to be functioning normal in a case in which the information is transmitted from the smart meter 10 to the HES 30 via the integration device 20 according to the normal route. The controller 64 extracts the integration device ID the history information of which has been "error" for a predetermined time or more from the information that is transmitted from the HES 30 and received by the fifth communicator 61. The predetermined time may be the second predetermined time, or a time different from the second predetermined time. The controller 64 determines that an anomaly is occurring in the smart meter 10 assigned the smart meter ID not associated with the extracted integration device ID in the meter location information DB 65*a*, and from which information has not been obtained for the second predetermined time or more.

Figure 11:
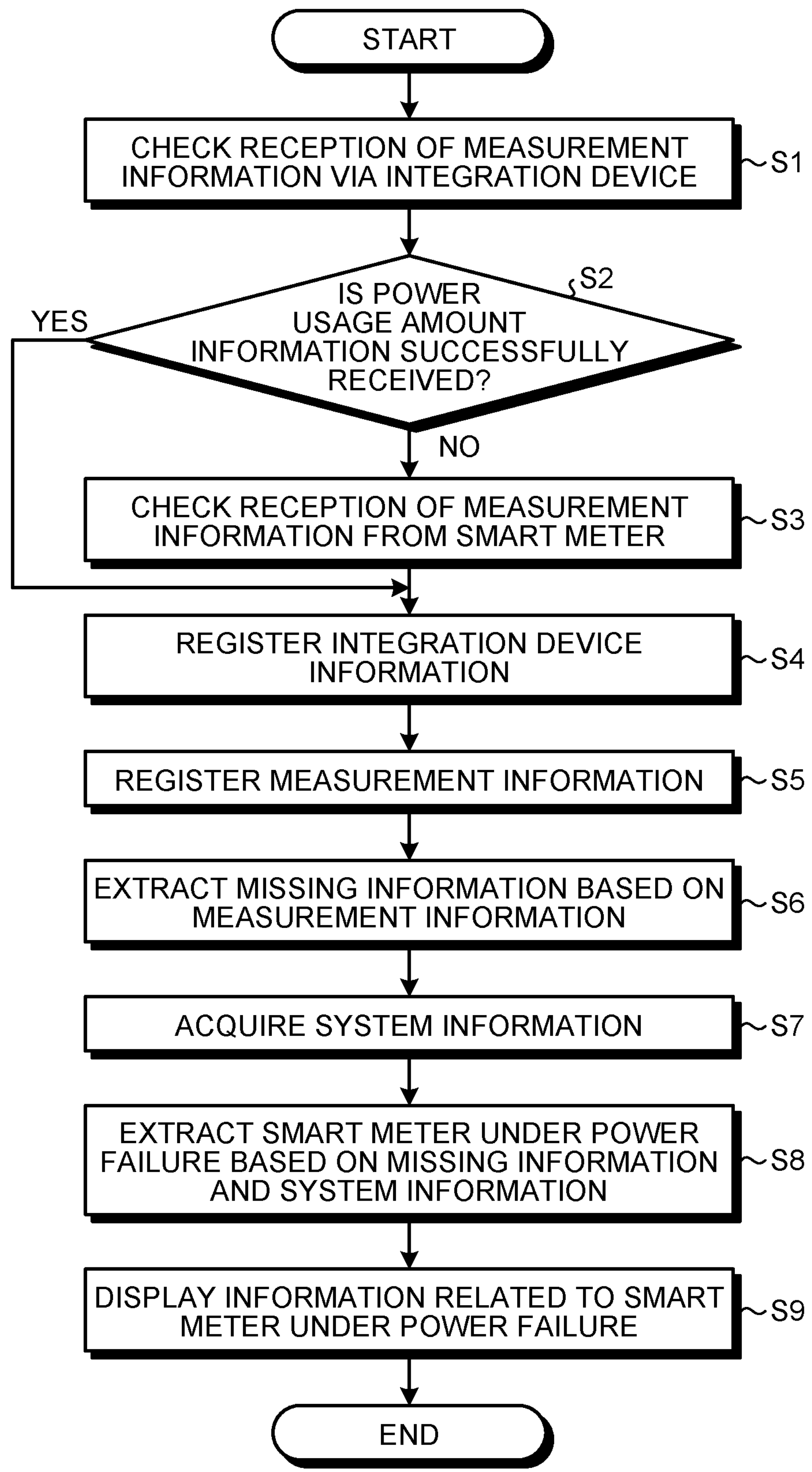
FIG. 11 is a flowchart illustrating an example of a data processing procedure performed by a disaster information visualizing system.

FIG. 11 is a flowchart illustrating an example of a data processing procedure performed by the disaster information visualizing system 1. The controller 33 checks reception of the information from the integration device 20 (Step S1). The controller 33 checks whether the information indicating the power usage amount is successfully received (Step S2). Specifically, the controller 33 checks whether the information is transmitted from the integration device 20, and checks, in a case in which the information is transmitted from the integration device 20, whether the information includes information indicating the power usage amounts associated with the respective smart meter IDs of all of the smart meters 10. In a case in which the information from the integration device 20 includes the smart meter ID of the smart meter 10 from which information is not obtained, and/or the smart meter ID associated with the information indicating the power usage amount that is unreadable due to a corruption and the like, the second communicator 31 performs a transmission for requesting information to the second communicator 14 of the smart meter 10 to which such a smart meter ID is assigned. In response to the transmission, the smart meter 10 transmits the information indicating the power usage amount via the second communicator 14. The controller 33 checks reception of the information from the smart meter 10 (Step S3).

Checking reception of the information at Step S1 and Step S3 is processing for checking whether the information indicating the power usage amount is normally obtained, and is not "checking that a state of obtaining normal information is confirmed".

The controller 33 registers a record in the integration device information DB 34*a* based on the information received by the third communicator 32 (Step S4). The controller 33 performs processing of integrating the power usage amounts that are individually measured by the smart meters 10 and received by the second communicator 31 and the third communicator 32, and causing the fourth communicator 35 to transmit the integrated data.

The controller 42 registers a record in the measurement information DB 43*a* based on the information received by the fourth communicator 41 (Step S5). The controller 42 or the controller 64 extracts information (missing information) on the smart meter 10 from which information has not been obtained for the second predetermined time or more based on the measurement information DB 43*a* (Step S6). The controller 64 acquires system information based on the information that is transmitted from the power distribution information providing device 50 and received by the seventh communicator 63 (Step S7). The controller 64 extracts the smart meter 10 from which information has not been obtained for the second predetermined time or more as the smart meter 10 under a power failure based on the missing information and the system information (Step S8). For example, as illustrated in FIG. 10, the power failure/disaster information output unit 66 performs an output for displaying information related to the smart meter 10 under a power failure (Step S9).

As described above, according to the embodiment, the information processing device includes a receiver (the sixth communicator 62) that receives information related to the smart meters 10, the controller 64 that determines presence or absence of an anomaly in each of the smart meters 10 based on the reception status of the information from each of the smart meters 10, and an output unit (the power failure/disaster information output unit 66) that outputs the information indicating presence or absence of an anomaly in each of the smart meters 10. The receiver (sixth communicator 62) receives the pieces of information from the smart meters 10 in a cycle of the first predetermined time. The controller 64 determines that an anomaly is occurring in a smart meter 10 from which information has not been obtained for the second predetermined time or more, which is longer than the first predetermined time. The second predetermined time is n times as long as the first predetermined time. Thus, the smart meter 10 from which information is not obtained multiple times in a row is determined to have an anomaly occurring therein. With this configuration, it is possible to extract, with higher accuracy, the smart meters 10 that are more likely to have ongoing anomalies. Thus, it is possible to determine a power failure caused by impairment of the function of the smart meter 10.

The information processing device also includes the storage 65 that stores the information indicating the locations of the smart meters 10. The output unit (power failure/disaster information output unit 66) outputs the map image indicating the location of the smart meter 10 in which an anomaly is occurring. Thus, the location of the smart meter 10 in which an anomaly is occurring can be visually grasped as a position on the map image.

The information processing device also includes an acquisition unit (the seventh communicator 63) that acquires the information indicating presence or absence of an anomaly in the power distribution system that is connected to the facility the power usage amount of which is detected by the smart meters 10. The storage 65 further stores information indicating a correspondence relation between each of the smart meters 10 and the power distribution system. An output unit (the power failure/disaster information output unit 66) outputs information indicating a relation between presence or absence of an anomaly in the power distribution system and presence or absence of an anomaly in each of the smart meters 10. Thus, it is possible to grasp a relation between a cause of the anomaly that the information related to the smart meter 10 cannot be obtained and presence or absence of an anomaly in the power distribution system.

The controller 64 determines that an anomaly is occurring in a smart meter 10 in a case in which the information has not been obtained for the second predetermined time or more from the smart meter 10 configured to detect the power usage amount of the facility connected to the power distribution system having no anomaly. Thus, the controller 64 can determine that the cause of the anomaly lies in the smart meter 10 more reliably.

The integration device 20 that relays information transmitted from one, some, or all of the smart meters 10 is interposed in the transmission and reception paths for the information related to the smart meters 10, so that the transmission path for the information from each of the smart meters 10 can be made more versatile.

The relay device (HES 30) that stores information indicating presence or absence of an anomaly in the integration device 20 is interposed in the transmission and reception paths for the information related to the smart meters 10, so that it becomes possible to determine the smart meter 10 in which an anomaly is occurring while taking into account the information indicating presence or absence of an anomaly in the integration device 20.

The controller 64 determines that an anomaly is occurring in a smart meter 10 in a case where information has not been obtained from the smart meter 10 for the second predetermined time or more and the integration device 20 having no anomaly is interposed in the transmission and reception path for the information related to the smart meter 10. Thus, the control unit 64 can determine that the cause of the anomaly lies in the smart meter 10 more reliably.

The embodiment described above is merely an example, and can be appropriately modified without departing from the technical feature of the present invention.

For example, in a case of transmitting part of the information registered in the measurement information DB 43*a*, the controller 42 may extract information on the smart meter ID included in a record including the indication number of "error" has been obtained for the second predetermined time or more in a row, and cause the sixth communicator 44 to transmit the information. In this case, the MDMS 40 functions as an extraction device that extracts, from the smart meters 10, the smart meter 10 from which information has not been obtained for the second predetermined time or more. In this case, the controller 64 determines that an anomaly is occurring in the smart meter 10 assigned the smart meter ID included in the information received from the MDMS 40. In this case, a processing load on the controller 64 can further be reduced.

The "information indicating presence or absence of an anomaly in each of the smart meters 10" output by the power failure/disaster information output unit 66 is not limited to the map image. For example, the power failure/disaster information output unit 66 may include a communication device that distributes information including the smart meter ID and the installation position as illustrated in FIG. 7 and FIG. 8 to the outside. In this case, based on the information, an external device or system outputs information in any form. For example, an external device may generate the map image as illustrated in FIG. 9. The power failure/disaster information output unit 66 and an external device or system that is provided to be able to communicate with the power failure/disaster information output unit 66 may output information related to the smart meter 10 that is experiencing an anomaly in the form of voice, e-mail, or the like.

One of a group of the second communicator 14 and the second communicator 31, and a group of the first communicator 13, the integration device 20, and the third communicator 32 can be omitted.

Each of the HES 30, the MDMS 40, the power distribution information providing device 50, and the disaster information visualizing device 60 illustrated in FIG. 1 is one device, but one, some, or all of them may be a system as a combination of a plurality of devices. One, some, or all of the HES 30, the MDMS 40, and the power distribution information providing device 50 may be integrated with the same device as the disaster information visualizing device 60.

FIG. 12 is a block diagram illustrating a principal configuration example of the disaster information visualizing system having a configuration different from that in FIG. 1. A disaster information visualizing device 70 illustrated in FIG. 12 is an information processing device having the functions of the HES 30, the MDMS 40, the power distribution information providing device 50, and the disaster information visualizing device 60 that have been described with reference to FIG. 1. That is, a controller 71 has the functions of the controller 33, the controller 42, the controller 51, and the sixth communicator 62.

In the example illustrated in FIG. 12, the data flow DF4, the data flow DF5, and the data flow DF6 are omitted, and the information is transmitted from the smart meter 10 and the integration device 20 through the data flow DF2 and the data flow DF3 to the second communicator 31 and the third communicator 32 that are included in the disaster information visualizing device 70. Thus, configurations corresponding to the fourth communicator 35, the fifth communicator 36, the fourth communicator 41, and the sixth communicator 44 are omitted.

The specific character strings of various pieces of information registered in the various kinds of DBs that are described above with reference to FIG. 2, for example, are merely examples, and the character strings are not limited thereto. The character strings can be replaced with other character strings, symbols, and the like having the same meaning.

What is claimed is:

1. An information processing device comprising:

a receiver configured to receive a first information related to a plurality of smart meters;

an acquisition unit that includes a communication circuit configured to acquire a second information indicating a presence or an absence of a power anomaly in a power distribution system connected to a facility, a power usage amount of the facility being detected by at least one of the smart meters, a storage configured to store a third information indicating locations of the smart meters and a fourth information indicating a correspondence relation between the locations of each of the smart meters and a component of the power distribution system, a controller that includes (i) a processor or (ii) an arithmetic circuit performing an arithmetic operation and a storage circuit storing a software program and is configured to determine presence or absence of a meter anomaly in each of the smart meters based on a reception status of the first information from each of the smart meters; and an output unit that includes (i) a display device displaying images or (ii) a communicator distributing an image to be displayed on an external display device, and is configured to output information indicating the presence or the absence of the meter anomaly in each of the smart meters and output information indicating a relation between the presence or the absence of the power anomaly in the power distribution system and the presence or the absence of the meter anomaly in each of the smart meters, wherein the receiver receives the first information from the smart meters in a cycle of a first predetermined time, the controller determines that the meter anomaly is occurring in a smart meter of the smart meters from which the first information has not been obtained for a second predetermined time that is longer than the first predetermined time, the second predetermined time is n times as long as the first predetermined time, n is equal to or greater than 2, and the output unit outputs a map image indicating a location of the smart meter in which the meter anomaly is occurring.

2. The information processing device according to claim 1, wherein when the first information has not been obtained for the second predetermined time or more from the smart meter among the smart meters that is configured to detect the power usage amount of the facility connected to the power distribution system having no power anomaly, the controller determines that the meter anomaly is occurring in the smart meter.

3. The information processing device according to claim 1, wherein an extraction device is interposed in transmission and reception paths for the first information related to the smart meters, and the extraction device includes (i) a first processor or (ii) a first arithmetic circuit performing a first arithmetic operation, a first storage circuit storing a first software program, and a first communication circuit and is configured to extract, from the smart meters, the smart meter from which the first information has not been obtained for the second predetermined time or more.

4. The information processing device according to claim 1, wherein an integration device is interposed in transmission and reception paths for the first information related to the smart meters, and the integration device includes (i) a second processor or (ii) a second arithmetic circuit performing a second arithmetic operation, a second storage circuit storing a second software program, and a second communication circuit and is configured to relay the first information transmitted from one or more of the smart meters.

5. The information processing device according to claim 4, wherein a relay device is interposed in the transmission and the reception paths for the first information related to the smart meters, and the relay device includes a (i) third processor or (ii) a third arithmetic circuit performing a third arithmetic operation, a third storage circuit storing a third software program, and a third communication circuit and is configured to store the first information indicating presence or absence of an anomaly received from the integration device.

6. The information processing device according to claim 5, wherein when the first information has not been obtained for the second predetermined time or more from the smart meter among the smart meters, the transmission and the reception paths of which has the integration device having no anomaly interposed, the controller determines that the meter anomaly is occurring in the smart meter.

7. The information processing device according to claim 1, wherein the map image depicts a first area where at least one of the smart meters does not have the meter anomaly, a second area where at least one of the smart meters does include the meter anomaly, and a third area where at least one of the smart meters is present in a power transmission stop area.

8. An anomaly visualizing system comprising:

a plurality of smart meters configured to transmit a first information indicating a power usage amount in a cycle of a first predetermined time;

an integration device that includes (i) a processor or (ii) an arithmetic circuit performing an arithmetic operation, a storage circuit storing a software program, and a communication circuit and is configured to relay the first information transmitted from one or more of the smart meters;

a relay device that includes a (i) first processor or (ii) a first arithmetic circuit performing a first arithmetic operation, a first storage circuit storing a first software program, and a first communication circuit and is configured to store a second information indicating a presence or an absence of a meter anomaly received from the integration device;

an extraction device that includes (i) a third processor or (ii) a third arithmetic circuit performing a third arithmetic operation, a third storage circuit storing a third software program, and a third communication circuit and is configured to extract, based on the first information from the smart meters, the integration device, or both, a smart meter among the smart meters from which the first information has not been obtained for a second predetermined time or more, the second predetermined time being longer than the cycle of the first predetermined time;

a power distribution information providing device that includes (i) a fourth processor or (ii) a fourth arithmetic circuit performing an arithmetic operation, a fourth storage circuit storing a fourth software program, and a fourth communication circuit and is configured to store power information indicating presence or absence of a power anomaly in a power distribution system connected to a facility, a power usage amount of the facility being detected by at least one of the smart meters; and an anomaly visualizing device that includes a fifth communication circuit provided to be able to communicate with the extraction device and the power distribution information providing device and is configured to output, based on information output from the extraction device and the power information from the power distribution information providing device, a map image indicating a location of the smart meter in which the meter anomaly is occurring, wherein the anomaly visualizing device comprises:

a storage configured to store information indicating locations of the smart meters, and fourth information indicating a correspondence relation between the locations of each of the smart meters and a component of the power distribution system, a controller that includes (i) a second processor or (ii) a second arithmetic circuit performing a second arithmetic operation and a second storage circuit storing a second software program, and is configured to determine the presence or the absence of the meter anomaly in each of the smart meters based on a reception status of the first information from each of the smart meters and configured to determine that the meter anomaly is occurring in the smart meter in a case in which the first information has not been obtained for the second predetermined time or more from the smart meter configured to detect the power usage amount of the facility connected to the power distribution system having no power anomaly, and an output unit that includes (i) a display device displaying images or (ii) a communicator distributing an image to be displayed on an external display device and is configured to output information indicating the presence or the absence of the meter anomaly in each of the smart meters, and output information indicating a relation between the presence or the absence of the power anomaly in the power distribution system and the presence or the absence of the meter anomaly in each of the smart meters, the second predetermined time is n times as long as the first predetermined time, n is equal to or greater than 2, and when the first information has not been obtained for the second predetermined time or more from the smart meter among the smart meters, transmission and reception paths of which has the integration device having no anomaly interposed, the controller determines that the meter anomaly is occurring in the smart meter.

9. The anomaly visualizing system according to claim 8, wherein the map image depicts a first area where at least one of the smart meters does not have the meter anomaly, a second area where at least one of the smart meters does include the meter anomaly, and a third area where at least one of the smart meters is present in a power transmission stop area.

* * * * *